United States Patent
Yagi

(10) Patent No.: US 9,354,262 B2
(45) Date of Patent: May 31, 2016

(54) PASSIVE INTERMODULATION MEASUREMENT APPARATUS

(75) Inventor: Kazuyuki Yagi, Hyogo (JP)

(73) Assignee: Kaysight Technologies, Inc., Santa Rosa, CA (US)

( * ) Notice: Subject to any disclaimer, the term of this patent is extended or adjusted under 35 U.S.C. 154(b) by 482 days.

(21) Appl. No.: 13/537,502

(22) Filed: Jun. 29, 2012

(65) Prior Publication Data

US 2014/0002097 A1     Jan. 2, 2014

(51) Int. Cl.
    *G01R 31/08*     (2006.01)
    *G01R 23/20*     (2006.01)
    *H04B 3/46*     (2015.01)

(52) U.S. Cl.
    CPC *G01R 23/20* (2013.01); *H04B 3/46* (2013.01); *G01R 31/083* (2013.01)

(58) Field of Classification Search
    CPC .................. G01R 23/20; G01R 31/08–31/088
    USPC .................................. 324/511–536, 620–626
    See application file for complete search history.

(56) References Cited

U.S. PATENT DOCUMENTS

| | | | | |
|---|---|---|---|---|
| 4,258,314 | A * | 3/1981 | Hirata | 324/620 |
| 4,648,124 | A * | 3/1987 | Mantovani et al. | 455/67.13 |
| 5,600,248 | A * | 2/1997 | Westrom et al. | 324/522 |
| 6,020,733 | A * | 2/2000 | Bradley | 324/76.23 |
| 8,666,322 | B1 * | 3/2014 | Bradley et al. | 455/67.11 |
| 8,816,672 | B1 * | 8/2014 | Bradley | 324/76.19 |
| 2002/0094785 | A1 * | 7/2002 | Deats | 455/67.3 |
| 2003/0040277 | A1 * | 2/2003 | Deats | 455/63 |
| 2006/0123289 | A1 * | 6/2006 | Williams | 714/724 |
| 2008/0319689 | A1 * | 12/2008 | Williams | 702/59 |
| 2010/0164504 | A1 * | 7/2010 | Bradley | 324/520 |
| 2010/0295533 | A1 * | 11/2010 | Kuga et al. | 324/76.39 |

FOREIGN PATENT DOCUMENTS

| | | |
|---|---|---|
| DE | 102010046099 A1 | 3/2012 |
| DE | 102012009317 A1 | 11/2013 |
| WO | WO2012009757 A1 | 1/2012 |

OTHER PUBLICATIONS

Search Report mailed Feb. 19, 2014 for German Patent Application No. 102013208810.8.

* cited by examiner

*Primary Examiner* — Patrick Assouad
*Assistant Examiner* — Demetrius Pretlow

(57) ABSTRACT

A method and apparatus are described for generally passive intermodulation measurement to specify a location and strength of an intermodulation source of a passive component in a transmission line. Beneficially, the apparatus and method are comparatively simple and inexpensive.

23 Claims, 5 Drawing Sheets

PASSIVE INTERMODULATION MEASUREMENT APPARATUS

BACKGROUND

In a base station used for mobile wireless communication, comparatively high power transmission signals and comparatively weak reception signals pass through the same path from a front end to an antenna of a base station. If a component such as cable and connector in such a path exhibits nonlinear behavior, intermodulation distortion (IMD) due to higher order (e.g., third order) nonlinearities can adversely impact the received signal and degrade performance. As can be appreciated, in certain applications, measurement of IMD can be useful to improve performance in wireless communication systems.

A known measurement apparatus determines a length of a cable from a test port to a passive intermodulation (PIM) source. In known the apparatus, an oscillator generates a sawtooth wave, and another oscillator generates a frequency modulated (FM) wave at a first frequency F1 (where sweep rate is ΔF/T). Another oscillator generates a wave at a second frequency F2, and a combiner mixes the waves of both frequencies to supply a test port. An output signal synthesized at the combiner is transmitted to the test port through an inner line and is further transmitted to the measured cable that is connected to the test port. An intermediate connection portion or a termination portion of the cable may be an interface at which a shape of the cable discontinuously changes or an interface at which dissimilar metals are in contact, and nonlinear distortion is often generated at the intermediate connection portion. When nonlinear distortion is generated at such an interface, the location of the interface is determined and is identified as a PIM generation source.

A third IMD signal is generated at the PIM generation source and has a frequency (2F1−F2) or (2F2−F1) that is transmitted through the cable in a return direction and arrives at the test port. If a pass frequency of a bandpass filter is set to (2F1−F2), a signal of the frequency (2F1−F2) passes through the bandpass filter and reaches a first input terminal of at a frequency mixer.

Meanwhile, based on the signal of the frequency F1 of the first oscillator, a higher harmonic wave 2F1 of twice the frequency is formed at a frequency doubler. The higher harmonic wave is mixed with the signal of the frequency F2 generated by the second oscillator at the frequency mixer, and the resulting signal of 2F1-F2 passes through the bandpass filter and is received at the frequency mixer 48.

In the known apparatus it is presumed that the two bandpass filters have same frequency and phase characteristics, group delay of the cable is independent of frequency, and a time lag of the other components is zero.

In the known apparatus, signals are transmitted at frequencies F1, F2 and are converted to a signal of frequency (2F1−F2) at the PIM generation source that returns to the port P1. The time delay becomes 2Td since the group delay Td of the cable is presumed to be constant in different frequencies. As a result, a distorted signal (Vu) generated at the PIM generation source arrives at an input of the frequency mixer with a delay of 2Td compared with a reference signal (Vr). Thus, the frequency of the signal Vu differs to the frequency of the reference signal Vr by 2Td·ΔF/T.

The shift of frequencies enables a time delay in the cable to be measured, and a physical length of L can be calculated if a wavelength shortening of the cable is known.

With the known measurement apparatus, the two bandpass filters used have a sharp bandpass characteristic passing (2F1−F2) component with enough attenuation of F1 and F2 components so that the receiver is not saturated, and so the frequency and phase characteristic of the bandpass filters should be the same. If there is a difference in the amplitude and phase characteristics of the two bandpass filters, a measurement error will be included in the measured value caused by the difference of the characteristics. However, bandpass filters having the sharp bandpass characteristic are comparatively expensive. Furthermore, two bandpass filters having sufficiently precise frequency and phase characteristics is also difficult.

In the known measurement apparatus, the reference signal Vr is generated with the aid of the frequency mixer, the frequency doubler and the bandpass filter. In the frequency mixer, a converted output signal appears not only at an output terminal but also at an input terminal. Therefore, to realize a dynamic range of more than 160 dBc in the PIM measurement, the converted signal at the input terminal of the frequency mixer should be prevented from reflecting back to the signal sources. In order to prevent this reflection, buffer circuits are required between the signal source and the frequency doubler, and between the frequency source and the frequency mixer. As can be appreciated preventing this reflection requires a rather complicated circuit configuration.

What is needed, therefore is a PIM measurement apparatus that overcomes at least the shortcomings of the known apparatus described above.

SUMMARY

In accordance with a representative embodiment, an apparatus for specifying a location of a passive intermodulation (PIM) source in a transmission line is disclosed. The apparatus comprises: a first signal source configured to generate a signal at a first frequency; a second signal source configured to generate a signal at a second frequency; a combiner configured to mix a first signal from the first signal source and a second signal from the second signal source; a reference signal source configured to provide a reference signal having a same frequency as a distortion component of a signal generated at the PIM generation source; a bandpass filter configured to pass the distortion component of the signal returning from the PIM generation source to the test port and to pass the signal generated by the reference signal source; and a measuring and computing unit configured to perform a measurement based on a signal passed by the bandpass filter when a switch is off and a signal passed by the bandpass filter when the switch is on and to compute the location of the PIM generation source.

In accordance with another representative embodiment, a method for determining a location of a passive intermodulation (PIM) source in a transmission line is disclosed. The method comprises: providing a reference signal of a same frequency as a distortion component generated by the PIM generation source; passing the distortion component returning from the PIM generation source and passing a distorted signal generated by a reference signal source; supplying a signal of a first frequency and a signal of a second signal source to the test port; passing a distortion component of a signal returning from the PIM generation source through a bandpass filter; passing a distortion component of a signal returning from the PIM generation source and the reference signal through the bandpass filter simultaneously; and performing a computation for specifying a location of the PIM generation source based on both signals that passed through the bandpass filter.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

As described more fully below, the present teachings relate a generally passive intermodulation measurement apparatus and measurement method to specify a location and strength of an intermodulation source of a passive component in a transmission line. Beneficially, the apparatus and method are comparatively simple and inexpensive.

The present teachings contemplate implementation in a vector network analyzers (VNA) such as those commercially available from Agilent Technologies, Santa Clara, Calif. USA.

The methods and apparatuses of the representative embodiments described below may be controlled as needed by a controller (not shown), such as a processor or central processing unit (CPU), application specific integrated circuits (ASICs), field-programmable gate arrays (FPGAs), or combinations thereof, using software, firmware, hard-wired logic circuits, or combinations thereof. Notably, the controller may be the controller of the VNA or similar device. Moreover, the measuring and computing unit described below may be instantiated in, controlled by, or comprise the controller.

When using a processor or CPU, a memory (not shown) is included for storing executable software/firmware and/or executable code that controls signals from the controller. The memory may be any number, type and combination of non-volatile read only memory (ROM) and volatile random access memory (RAM), and may store various types of information, such as computer programs and software algorithms executable by the processor or CPU. The memory may include any number, type and combination of tangible computer readable storage media, such as a disk drive, an electrically programmable read-only memory (EPROM), an electrically erasable and programmable read only memory (EEPROM), a CD, a DVD, a universal serial bus (USB) drive, and the like.

Figure 1:
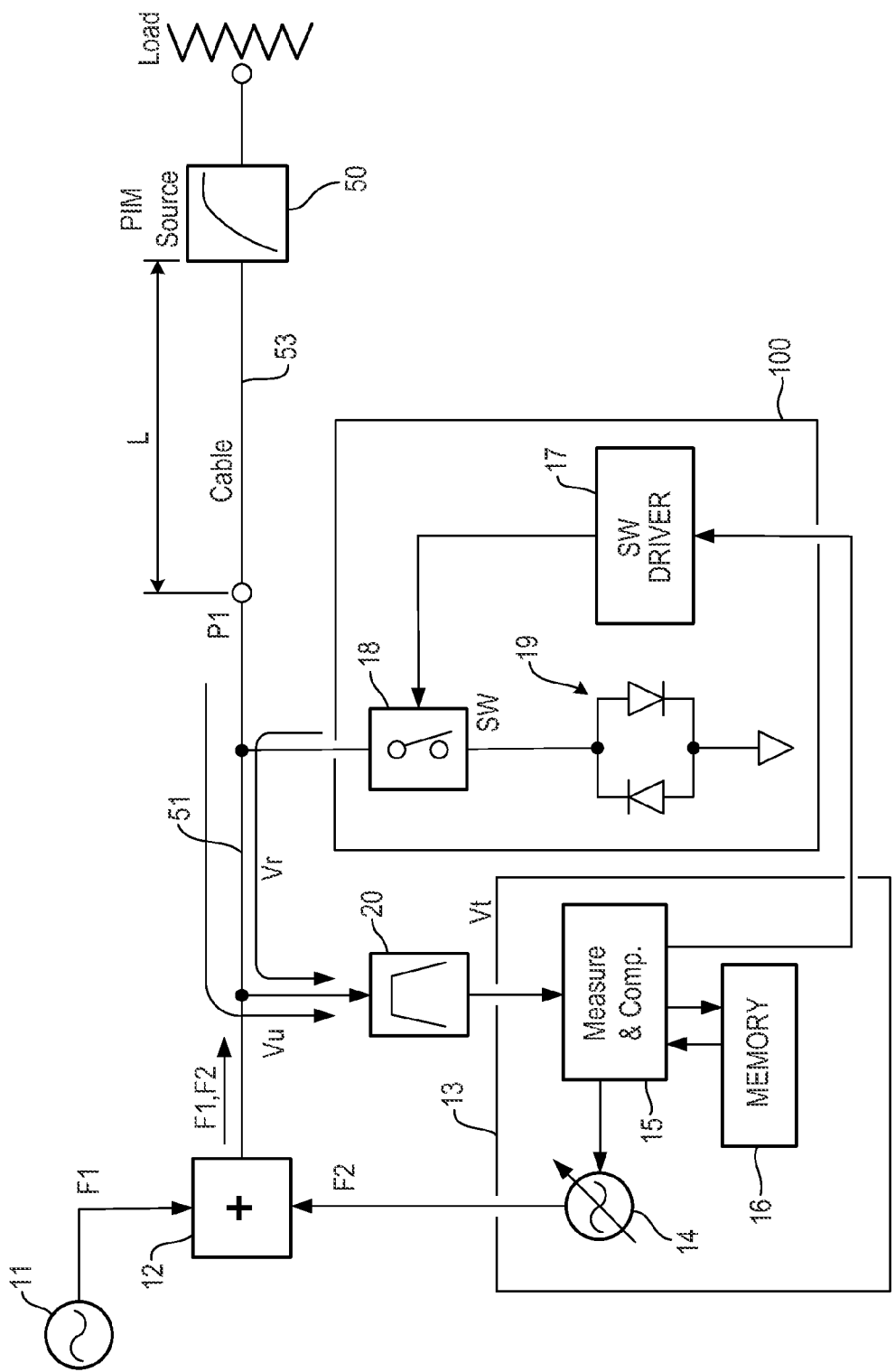
FIG. 1 is a schematic block diagram of a circuit arrangement of an intermodulation measurement apparatus according to a representative embodiment.

FIG. 1 is a simplified schematic block diagram of a circuit arrangement of an intermodulation measurement apparatus according to a representative embodiment. The intermodulation measurement apparatus comprises a first signal source 11 configured to output a signal of a fixed frequency F1 and a second signal source 14 configured to output a signal of a variable frequency F2.

The output signal of the first signal source 11 and the output signal of the second signal source 14 are mixed at a combiner 12 and respective signals of having frequencies F1 and F2 are output therefrom. The output signals are transmitted through an internal cable 51 and arrive at a test port P1.

A cable 53 is connected to the test port P1. Illustratively, the cable 53 comprises a section of a transmission line, and terminates at a load such as an antenna. For example, the cable 53 connects an antenna, a transmission line and receiver equipment used in a mobile communication base station for cellular phones and the like. Notably, the cable 53 may have one or more relaying connectors interposed at intermediate positions along its length. These relaying connectors may be, for example IMD generation sources that can degrade performance of the transceiver system.

In FIG. 1, a PIM generation source 50 is disposed in a transmission line with a distance "L" between the PIM generation source 50 and the test port P1. It is noted that in the present embodiment a single PIM generation source is depicted and described. In other embodiments described below, a plurality of PIM generation sources 50 may be in the transmission line, and may be located according to the present teachings.

Though a number of orders of IMD are generated from the PIM generation source 50, a third order IMD, which is a dominant source of IMD, is discussed below for simplicity of description and without significant loss of generality. The third order IMD includes a (2F1−F2) component and a (2F2−F1) component; however, hereinafter a case of (2F2−F1) is discussed for ease of description. In this example, F1 is greater than F2.

A bandpass filter 20 configured to pass a PIM signal with a frequency of (2F2−F1) is connected to the test port P1 or the internal cable 51. A PIM signal from the PIM generation source 50 is indicated "Vu". A PIM signal that is passed by the bandpass filter 20 is indicated "Vt" and is input into a measuring and computing unit 15.

Also, a reference signal source 100 is connected to the test port P1 or the internal cable 51. Illustratively, the reference signal source 100 generates a signal having substantially the same frequency as the distortion component generated by PIM generation source 50. The reference signal source 100 comprises a switch driver 17, an on/off switch 18, and a distorted wave generation circuit 19 that generates a reference signal. The distorted wave generation circuit 19 is connected to the test port P1 and to the internal cable 51 through the on/off switch 18. The distorted wave generation circuit 19 comprises non-linear elements, and receives signals of frequencies F1 and F2 from the combiner 12 when the on/off switch 18 is "on" and generates a reference signal of frequency 2F2−F1. This signal is indicated "Vr".

Simultaneously, another frequency component such as (2F1−F2) is generated. However, this signal is not sensed by the measuring and computing unit 15. A switch driver 17 that controls operations of the on/off switch 18 is connected and the switch driver 17 drives the on/off switch 18 each time a trigger signal is received from the measuring and computing unit 15.

In operation, signals of frequencies F1 and F2 from the combiner 12 pass through a portion of the internal cable 51, through the on/off switch 18, reach to the distorted wave generation circuit 19 where a component of frequency 2F2−F1 is produced, and reach to the bandpass filter 20 through the on/off switch 18. The reference signal Vr is output from the bandpass filter 20. Although the reference signal Vr differs in frequency in transmission and reception, the internal cable 51 in the transmit/receive path is adequately wide in frequency bandwidth with respect to the frequency range used and so that the time delay is approximately constant within the range of use. For example, if F1 is 1880 MHz and F2 is 1805 MHz, 2F2-F1 becomes 1730 MHz. The usage frequency range of the cable is from 1730 MHz to 1880 MHz and it can be assumed that the time delay is constant within this range. For the convenience of description, the time delay is assumed to be zero. An example where the time delay is not zero is described below.

The signal $V_u$ originates from signals of frequencies F1 and F2 that are transmitted through the cable 53, converted to a signal of the frequency (2F2−F1) at the PIM generation source 50 and returned to the test port P1. As such, the signal $V_u$ is transmitted through a distance that is twice the sum of each length of the internal cable 51 and the cable 53. It is assumed that the time delay of the internal cable 51 is zero and thus the time delay of $V_u$ is twice the delay due to the length L of the cable 53.

In operation, $V_t$ is measured with the frequency of the first signal source 11 being set to F1, the second signal source 14 being set to F2, and the on/off switch 18 being turned off. Only $V_u$ is input into the bandpass filter 20 and thus $V_u$ is input as a measured signal $V_t$ into the measuring and computing unit 15. Thus, $V_t=V_u$. This vector value of the measured signal is expressed as $V_{t1}$ (off). The on/off switch 18 is then turned on and a signal $V_t$ is measured. In this operation, $V_u$ and reference signal $V_r$ output from a reference signal source 100 are input simultaneously into the bandpass filter 20. Accordingly, both signals $V_u$ and $V_r$ are input into the measuring and computing unit 15. Thus, $V_t=V_u+V_r$. The input value at this point is expressed as $V_{t1}$(on). The frequency of F2 is then increased by a factor "Δ." The frequency of the PIM signal $V_u$ is expressed as (2(F2+Δ)−F1), and is thereby increased by a factor "2Δ." The on/off switch 18 is turned off and on at this frequency and the respective values are measured. The measured values are expressed as $V_{t2}$(off) and $V_{t2}$(on).

Based on $V_{t1}$ (off), $V_{t1}$ (on), $V_{t2}$ (off) and $V_{t2}$ (on), the measuring and computing unit 15 determines an electrical length of the cable 53 with the following operation and determines a physical length from a known wavelength shortening. First, the signal $V_u$ from the PIM generation source 50 and the signal $V_r$ from the reference signal source 100 are separated from the measured signal $V_t$. Namely, the measuring and computing unit 15 determines values of $V_{r1}, V_{r2}, V_{u1}$ and $V_{u2}$ by following operations: $V_{r1}=V_{t1}$(on)$-V_{t1}$(off); a measured value of reference signal at frequency (2F2−F1), $V_{u1}=V_{t1}$ (off); a measured value of PIM generation source signal at frequency (2F2−F1), $V_{r2}=V_{t2}$(on)$-V_{t2}$(off); a measured value of reference signal at frequency (2(F2+Δ)=F1), and $V_{u2}=V_{t2}$(off); and a measured value of PIM generation source signal at frequency 2(F2+Δ)−F1). All of the values referenced immediately above are vector quantities.

The phases of signals $V_u$ and $V_r$ are dependent on the phases of the original signals having frequencies F1 and F2 and differences of transmission paths in the transmission line through 53 which signals having frequencies F1 and F2 and signals $V_u$ and $V_r$ are propagated. The phase difference of F1 and F2 influences $V_u$ and $V_r$ in common, and thus the factor that causes the phase difference between $V_u$ and $V_r$ is the time difference of the path through which the signals are transmitted. The phase difference between $V_u$ and $V_r$ depends on the length L of the cable 53 because it is assumed that the time delay of the measurement system inward from the test port P1 is assumed to be zero. When a phase component of a vector quantity $V_u/V_r$ is expressed as Phase[$V_u/V_r$], a value (Phase[$V_{u1}/V_{r1}$]−Phase[$V_{u2}/V_{r2}$]) is the phase shift due to the time delay of the cable 53 when the frequency changes by 2Δ. The length L of the cable 53 is thus determined by the following equation:

$$L=-(\text{Phase}[V_{u1}/V_{r1}]-\text{Phase}[V_{u2}/V_{r2}])/(4\Delta\pi)/SCW/2 \quad (1)$$

where SCW is the wavelength shortening of the cable 53, and the phase is expressed in units of radians.

The above description is based on the following assumptions:

(A) the time delay of the internal system of the measurement system is zero, and (B) the PIM signal source to be measured is present at one location.

A solution based on the assumption that the time delay of the internal system of the measurement system is zero to determine the length L of the cable 53 with consideration of the time delay of the internal system of the measurement system is described presently. Before connecting the cable 53 to the test port P1, a PIM signal source, such as the distorted wave generation circuit 19 of FIG. 1, is connected to test port P1 (and the on/off switch 18 may be constantly "on"). The length L of cable 53 is then calculated using equation (1). The time delay difference (which may be a negative value) of the reference signal source 100 and the test port P1, is thereby determined. This value is expressed as "$L_{inner}$".

The cable 53, which is the object of measurement and includes the PIM generation source 50, is then connected to the test port P1, the above described measurement is performed, and the length L of the cable 53 is calculated again. If the value at this point is expressed "Lt", the length L of the cable is given by: $L=Lt-L_{inner}$.

A solution to the case where the PIM signal source to be measured is present at one location is now described. In this case, a plurality of PIM generation sources 50 are present and the length L between the test port P1 and each PIM generation source 50 is determined.

When it is known that the PIM generation source 50 is present at a single location, measurements are made at two points separated by 2Δ in measurement frequencies. When there are a plurality of PIM generation sources 50, measurements are made for frequency points (N points) that are adequately more numerous than the number locations of PIM generation sources 50. The difference of frequency of measurement frequency points which are adjacent to each other is 2Δ. The number N of vector values, $V_{u1}/V_{r1}, V_{u2}/V_{r2}, \ldots$, $V_{uN}/V_{rN}$ are obtained in accordance with the same procedure described in connection with FIG. 4 below as that for the measurement of two points described above. Then, the vector values along with the frequency axis are depicted as shown in FIG. 5 (a), which depicts frequency characteristics of signals $V_u$ which are returned from the plural of PIM generation sources 50 in the cable 53 with frequency points measured at 2Δ frequency intervals.

Figure 5:
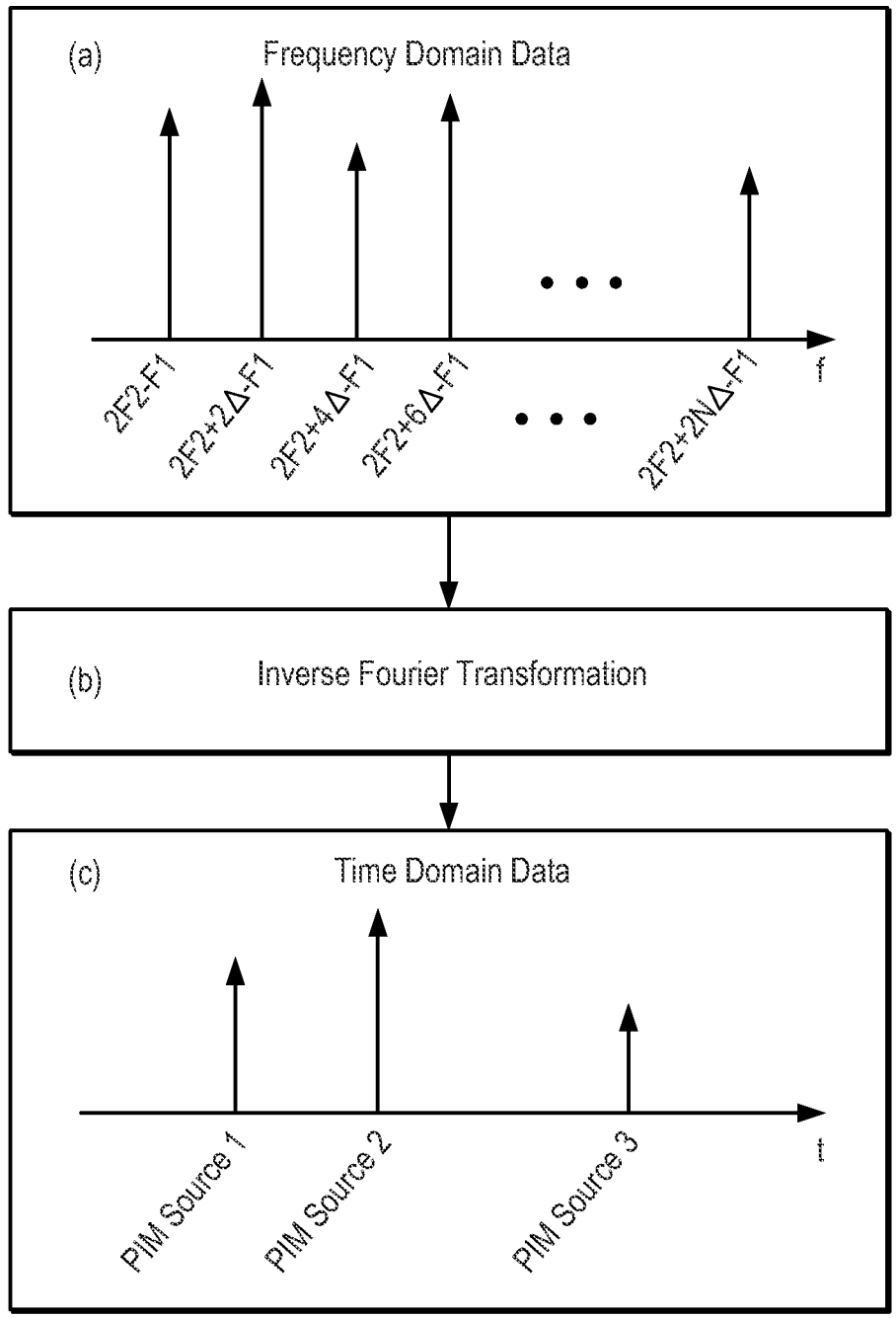
FIG. 5 is a schematic diagram of a method of measurement and calculation in accordance with a representative embodiment.

FIG. 5 (a) depicts magnitudes of data on the frequency axis. However, each data point should be vector value including the phase of the signal. By transformation of these data to the time axis by the inverse Fourier transformation depicted in FIG. 5 (b), the positions of and the generation amounts at the respective PIM generation sources can be decomposed along the time axis shown as FIG. 5 (c).

Notably, the method described above in connection with certain embodiments enables the determination frequencies and phases of S-parameters (typically S11) of a transmission line in which reflection points are present at a plurality of locations so that reflection positions (times) and reflection magnitudes can be determined by transformation to the time axis by the inverse Fourier transformation.

For purposes of illustration of the present teachings, an example is described in connection with a measurement in a cellular communications system. The representative embodiment allows the determination of the locations of a plurality of PIM generation sources in the cellular communications system. In one type of digital cellular phone communication system, DCS1800, a transmission bandwidth is 1805 MHz to 1880 MHz and a receiving bandwidth is 1710 MHz to 1785 MHz. If F1=1880 MHz and F2=1805 MHz, the third-order PIM component (2F2−F1) becomes 1730 MHz. If F2 is 1832.5 MHz, the third-order PIM component is 1785 MHz and a maximum band width to be measured becomes 55 MHz and the theoretical time resolution in this case is calculated by $1/(2\Delta N)$, approximately 18.2 nsec. As $2\Delta N$ is 55 MHz and thus if $\Delta$ is 500 KHz, the value of N becomes 55. Maximum value in the time axis is determined by calculating $1/(2\Delta)$. Therefore, a user decides $\Delta$ so that the maximum value covers length of cable that the user intends to measure and decides N so that maximum band width decided by $2\Delta N$ is adequate. For practical purposes, satisfactory results are obtained with N being 30 to 200.

Referring again to FIG. 1, respective functions of the measuring and computing unit 15, the second signal source 14, and a memory 16 connected to the computing unit 15 can be realized using a vector network analyzer (VNA) 13. The vector network analyzer 13 preferably has (1) a frequency offset function enabling an output frequency and a reception frequency to be set to different frequencies; (2) a function for performing not just comparative measurement but also for performing absolute value measurement, including that of phase information; (3) a segment sweep function enabling setting of an arbitrary frequency range, setting of a number of measurement points, sweep mode, sweep time, etc., and making of successive measurements at the measurement points; and (4) a point trigger function enabling setting of an appropriate time point as an external trigger and enabling a trigger to be made effective at each measurement. For example, the vector network analyzer "E5071C," commercially available from Agilent Technologies, Inc., Santa Clara, Calif. USA may be used.

Figure 2A:
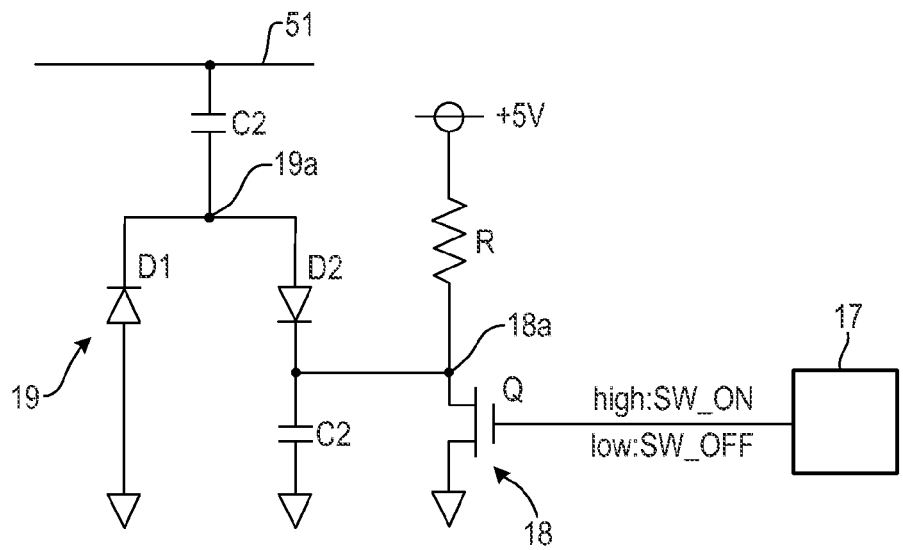
FIGS. 2A, 2B and 2C show simplified circuit diagrams of a specific example of an on/off switch and a distorted wave generating circuit in accordance with representative embodiments.
Figure 3:
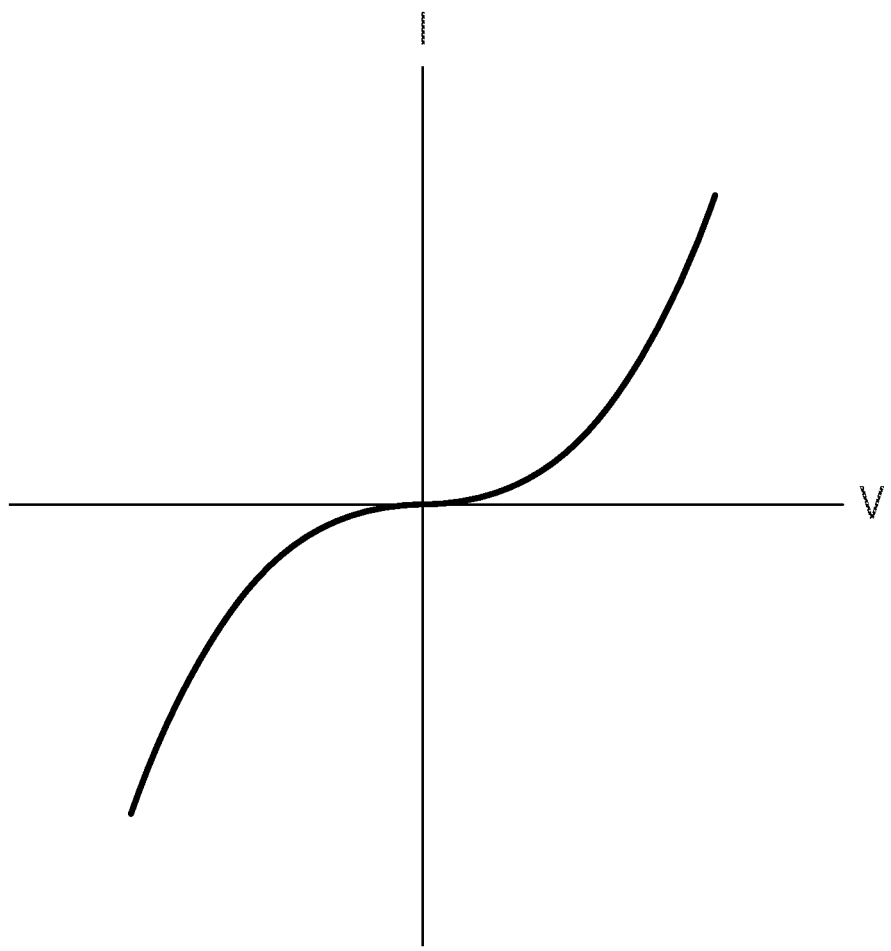
FIG. 3 is a graph of nonlinear characteristics of a diode.

FIG. 2A is a simplified circuit diagram of an illustrative on/off switch 18 and the distorted wave generation circuit 19. The distorted wave generation circuit 19 includes a parallel circuit of two Schottky barrier diodes D1 and D2. The Schottky barrier diodes D1 and D2 are mutually reversed in an anode-cathode sequence. A high-frequency voltage V applied to the parallel circuit and a high-frequency current I are provided from the parallel circuit. The resultant I-V curve approximates a third-order curve as shown in FIG. 3 due to nonlinear behavior of the Schottky barrier diodes D1 and D2. As such, the distorted wave generation circuit 19 functions as a non-linear device.

One end 19a of the parallel circuit comprising two Schottky barrier diodes D1 and D2 is connected to the internal cable 51 through a capacitor C1 and the distorted wave is thereby supplied to the internal cable 51. The anode of the Schottky barrier diode D1 of the parallel circuit is grounded, and the cathode of the Schottky barrier diode D2 is grounded through a capacitor C2. The capacitor C2 is provided to apply a bias voltage across the diodes D1 and D2.

The cathode of the diode D2 is connected to a switching element Q via a node 18a, and by operation of the switching element Q, the voltage at the node 18a can be switched between a ground side (for example, 0V) and a power supply side (for example, 5V). That is, in a state where the switching element Q is on, the node 18a is substantially at a ground potential and the diodes D1 and D2 are in an active state, and can generate the distorted wave. However, when the switching element Q is turned off, the node 18a is substantially at a power supply potential, and the diodes D1 and D2 are put in a state where a reverse bias voltage is applied. The diodes D1 and D2 are thus put in an equivalently open state so that a current cannot flow and the distorted wave cannot be generated.

It is emphasized that the distorted wave generation circuit 19 is merely illustrative and in no way limiting of the scope of the present teachings. More generally, the methods and apparatuses of the present teachings may be implemented to measure many different types of distorted wave generation circuits that include a nonlinear element.

Figure 2B:
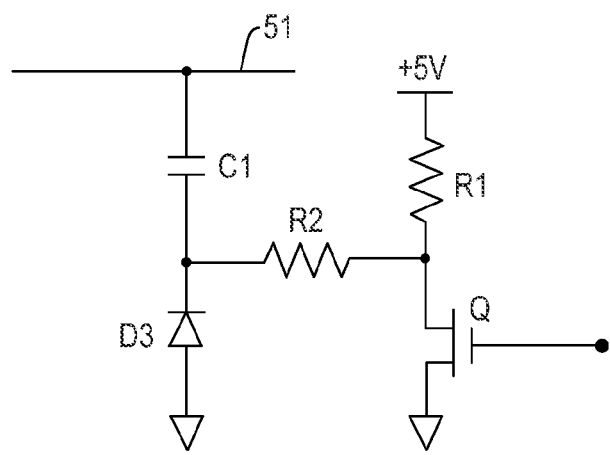

FIG. 2B shows a circuit wherein only one diode D3 is used. Resistors R1, R2 are for applying a bias voltage.

Figure 2C:
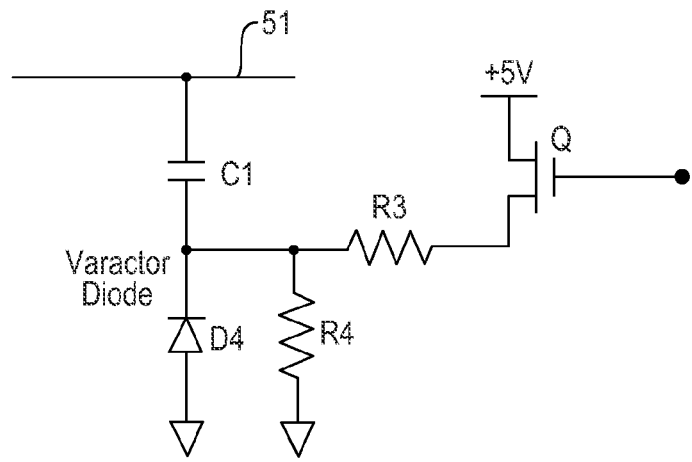

FIG. 2C shows a circuit that utilizes a non-linear capacitance characteristic of a varactor diode D4. When the switch Q is on, the varactor diode D4 is under a zero bias and functions as a nonlinear capacitor. When the switch Q is off, the diode D4 passes through and becomes a low resistance device, and no distortion is generated.

Figure 4:
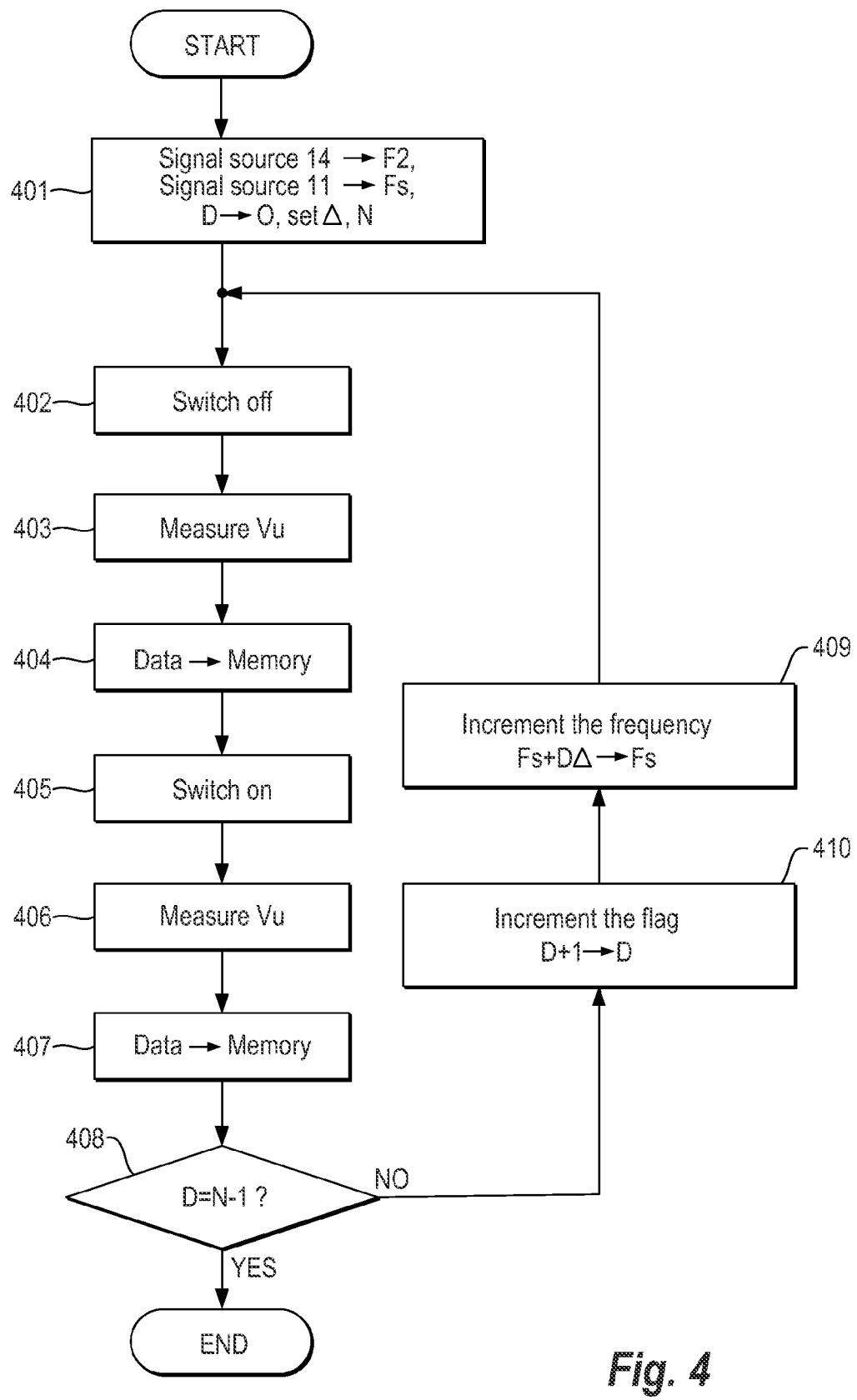
FIG. 4 is a flowchart of a measurement method in accordance with a representative embodiment.

FIG. 4 is a simplified flowchart of a measurement method 400 for specifying the position of the PIM generation source 50 performed by the computing unit 15 in accordance with a representative embodiment. It is noted that the apparatuses and components thereof described above are contemplated for use in implementing the method of the presently described representative embodiment.

At 401, the method begins by initializing the measurement. Notably the frequencies of the second signal source 14 are set to F2, and the switch driver 17 is set to Fs. A flag D indicative of returning times to D is also set. Moreover, an increment frequency $\Delta$ and a number of N that is 1 plus an increment number of the first signal source 11 is set. Notably, D is a positive integer and N is an integer $\geq 2$.

At 402, the distorted wave generation circuit 19 is switched off.

At 403, a phase and an amplitude of the (2F2−F1) component that passes through the bandpass filter from the PIM generation source is measured.

At 404, the measured value Vd (off) (d=D+1) is stored in the memory 16.

At 405, the distorted wave generation circuit 19 is switched on.

At 406, a sum of the components from the PIM generation source and from the distorted wave generation circuit 19 is measured.

At 407, the measured value Vd (on) is stored in the memory 16.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. An apparatus for specifying a location of a passive intermodulation (PIM) generation source in a transmission line, the apparatus comprising:
   a reference signal source configured to provide a reference signal having a same frequency as a distortion component of a signal generated at the pim generation source, the reference signal source comprises a circuit arrangement that uses a nonlinear element for generating, wherein, based on the signal from the frequency combiner when the switch is on, a signal of a same frequency with the distorted component from the pim generation source;
   a bandpass filter configured to pass the distortion component of a signal returning from the pim generation source to a test port and to pass the signal generated by the reference signal source; and
   a measuring and computing unit configured to perform a measurement based on a signal passed by the bandpass filter when a switch is off and a signal passed by the bandpass filter when the switch is on and to compute the location of the pim generation source.

2. The apparatus according to claim 1, wherein the measuring and computing unit is configured to compute phase differences between the reference signal that passed through the bandpass filter and the distorted signal from the pim generation source that passed through the bandpass filter.

3. The apparatus according to claim 2, wherein the measurement and computing unit is configured to compute an inverse Fourier transformation to specify at least either one of the locations of the pim generation sources or the magnitude of the distorted signal originated from pim generation sources.

4. The apparatus according to claim 3, wherein at least either one of the first frequency and the second frequency shifts between at least two values.

5. An apparatus according to claim 1, wherein the apparatus comprises a vector network analyzer.

6. A method for determining a location of a passive intermodulation (PIM) generation source in a transmission line, the method comprising:
   providing a reference signal of a same frequency as a distortion component generated by the pim generation source;
   passing the distortion component returning from the pim generation source and passing a distorted signal generated by a reference signal source;
   supplying a signal of a first frequency and a signal of a second signal source to a test port;
   passing a distortion component of a signal returning from the pim generation source through a bandpass filter;
   passing a distortion component of a signal returning from the pim generation source and the reference signal through the bandpass filter simultaneously; and
   performing a computation for specifying a location of the pim generation source based on both signals that passed through the bandpass filter.

7. The method according to claim 6, wherein the performing the computation comprises computing a phase difference between the signal from the reference signal source that passed through the bandpass filter when a switch is on and the distorted signal from the pim generation source that passed through the bandpass filter when the switch is off, based on first a frequency difference and a second frequency difference to specify the location of the pim generation source.

8. The method according to claim 7, wherein at least either one of the first frequency and the second frequency shifts between at least two values, and the first frequency difference is a frequency difference between the first frequency and the second frequency and the second frequency difference is a shifted frequency difference between the first frequency and the second frequency.

9. The method according to claim 6, wherein the performing further comprises computing phase differences between the reference signal from the reference signal source that passed through the bandpass filter and the distorted signal from the pim generation source that passed through the bandpass filter.

10. The method according to claim 9, wherein the performing further comprises performing an inverse Fourier transformation, at each frequency difference, to specify at least either one of the locations of the pim generation sources or the magnitude of the distorted signal originated from pim generation sources, wherein at least either one of the first frequency and the second frequency shifts between at least two values.

11. A method for using a vector network analyzer for measuring a passive intermodulation for specifying a location of a passive intermodulation (PIM) generation source in a transmission line connected to a test port, the method comprising:
   generating a reference signal of a same frequency as a distortion component generated in the pim generation source to the test port by switching a switch responding a control signal from the vector network analyzer;
   providing one bandpass filter that passes the distortion component returning from the pim generation source to the test port and passes the distorted signal generated by the reference signal source;
   supplying a signal of a first frequency and a signal of a second signal source to the test port;
   passing a distortion component of a signal returning from the pim generation source to the test port when the switch is off, through the one bandpass filter;
   passing a distortion component of a signal returning from the pim generation source to the test port and the signal generated by the reference signal source when the switch is on, through the bandpass filter simultaneously; and
   performing a measurement and computation by the vector network analyzer for specifying the position of the pim generation source based on both signals that passed through the bandpass filter when the switch is on and off.

12. The method for using the vector network analyzer according to claim 11, wherein the network analyzer computes a phase difference between the signal from the reference signal source that passed through the bandpass filter when the switch is on and the distorted signal from the pim generation source that passed through the bandpass filter when the switch is off, based on first a frequency difference and a second frequency difference to specify the location of the pim generation source.

13. The method for using the vector network analyzer according to claim 12, wherein at least either one of the first frequency and the second frequency shifts between at least two values, and the first frequency difference is a frequency difference between the first frequency and the second frequency and the second frequency difference is a shifted frequency difference between the first frequency and the second frequency.

14. The method for using the vector network analyzer according to claim 11, wherein the performing further comprises computing phase differences between the reference signal from the reference signal source that passed through the bandpass filter and the distorted signal from the pim generation source that passed through the bandpass filter.

15. The method according to claim 14, wherein the performing further comprises performing an inverse Fourier transformation, at each frequency difference, to specify at least either one of the locations of the pim generation sources or the magnitude of the distorted signal originated from pim generation sources, wherein at least either one of the first frequency and the second frequency shifts between at least two values.

16. An apparatus for specifying a location of a passive intermodulation (PIM) generation source in a transmission line, the apparatus comprising:
- a reference signal source configured to provide a reference signal having a same frequency as a distortion component of a signal generated at the pim generation source;
- a bandpass filter configured to pass the distortion component of the signal returning from the pim generation source to a test port and to pass the signal generated by the reference signal source; and
- a measuring and computing unit configured to perform a measurement based on a signal passed by the bandpass filter when a switch is off and a signal passed by the bandpass filter when the switch is on and to compute the location of the pim generation source, wherein the measuring and computing unit computes a phase difference between the signal from the reference signal source that passed through the bandpass filter when the switch is on, and the distorted signal from the pim generation source that passed through the bandpass filter when the switch is off, based on a first frequency difference and a second frequency difference to specify the location of the pim generation source.

17. The apparatus according to claim 16, wherein the measuring and computing unit computes a phase difference between the signal from the reference signal source that passed through the bandpass filter when the switch is on and the distorted signal from the pim generation source that passed through the bandpass filter when the switch is off, based on a first frequency difference and a second frequency difference to specify the location of the pim generation source.

18. The apparatus according to claim 17, wherein at least one of the first frequency and the second frequency shifts between at least two values, and the first frequency difference is a frequency difference between the first frequency and the second frequency and the second frequency difference is a shifted frequency difference between the first frequency and the second frequency.

19. The apparatus according to claim 16, wherein the measuring and computing unit is configured to compute phase differences between the reference signal that passed through the bandpass filter and the distorted signal from the pim generation source that passed through the bandpass filter.

20. The apparatus according to claim 19, wherein the measurement and computing unit is configured to compute an inverse Fourier transformation to specify at least either one of the locations of the pim generation sources or the magnitude of the distorted signal originated from pim generation sources.

21. The apparatus according to claim 20, wherein at least either one of the first frequency and the second frequency shifts between at least two values.

22. The apparatus according to claim 16, wherein the reference signal source includes a circuit arrangement that uses a nonlinear element for generating, based on a signal from a frequency combiner when the switch is on, a signal of a same frequency with the distorted component from the pim generation source.

23. An apparatus according to claim 16, wherein the apparatus comprises a vector network analyzer.

* * * * *